United States Patent
Han et al.

(10) Patent No.: US 11,942,344 B2
(45) Date of Patent: Mar. 26, 2024

(54) METHOD OF DETERMINING A CRITICAL TEMPERATURE OF A SEMICONDUCTOR PACKAGE AND APPARATUS FOR PERFORMING THE SAME

(71) Applicant: SAMSUNG ELECTRONICS CO., LTD., Suwon-si (KR)

(72) Inventors: Ilyoung Han, Uiwang-si (KR); Mingi Hong, Hwaseong-si (KR); Choongbo Shim, Asan-si (KR); Heejin Kim, Cheonan-si (KR); Nungpyo Hong, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 257 days.

(21) Appl. No.: 17/224,564

(22) Filed: Apr. 7, 2021

(65) Prior Publication Data
US 2022/0102172 A1    Mar. 31, 2022

(30) Foreign Application Priority Data
Sep. 25, 2020   (KR) .......................... 10-2020-0124479

(51) Int. Cl.
*H01L 21/67* (2006.01)
*G01J 5/00* (2022.01)
*G01K 13/00* (2021.01)

(52) U.S. Cl.
CPC .......... *H01L 21/67248* (2013.01); *G01J 5/00* (2013.01); *G01K 13/00* (2013.01); *H01L 21/67103* (2013.01)

(58) Field of Classification Search
CPC .......... H01L 21/67248; H01L 21/67103; G01J 5/00; G01K 13/00
USPC .......................................................... 374/55
See application file for complete search history.

(56) References Cited

U.S. PATENT DOCUMENTS

| | | | | |
|---|---|---|---|---|
| 4,851,764 A | * | 7/1989 | Usui .................. | G01R 31/2863 324/750.09 |
| 5,601,364 A | * | 2/1997 | Ume ....................... | G01N 3/60 250/237 G |
| 5,645,351 A | * | 7/1997 | Nakata ............... | G01N 29/2418 374/161 |
| 7,187,164 B2 | * | 3/2007 | Kim .................. | G01R 31/2891 324/750.02 |
| 8,773,763 B2 | | 7/2014 | Steenblik et al. | |

(Continued)

FOREIGN PATENT DOCUMENTS

| | | | | |
|---|---|---|---|---|
| CN | 103268862 A | * | 8/2013 | ......... H01L 23/3135 |
| JP | 4390685 A | | 5/2006 | |

(Continued)

*Primary Examiner* — Natalie Huls
(74) *Attorney, Agent, or Firm* — Fish & Richardson P.C.

(57) ABSTRACT

In a method of determining a critical temperature of a semiconductor package, heat is applied to at least one semiconductor package. Temperatures of the semiconductor package are measured during the heating. Heights of the semiconductor package are also measured during the heating. A temperature of the semiconductor package measured at a point at which a height from among the measured heights of the semiconductor package is sharply increased so that swelling of the semiconductor package occurs is determined as the critical temperature of the semiconductor package. Thus, the critical temperature of the semiconductor package may be accurately determined.

19 Claims, 11 Drawing Sheets

(56) References Cited

U.S. PATENT DOCUMENTS

| | | | |
|---|---|---|---|
| 11,313,739 B2* | 4/2022 | Cairns | G01K 11/006 |
| 2003/0183613 A1* | 10/2003 | Takano | H01L 21/67248 |
| | | | 219/390 |
| 2007/0242721 A1 | 10/2007 | Lin et al. | |
| 2008/0095211 A1* | 4/2008 | You | G01R 31/2868 |
| | | | 374/45 |
| 2009/0175992 A1 | 7/2009 | Bekele | |
| 2009/0269863 A1* | 10/2009 | Tomita | H01L 22/20 |
| | | | 257/E21.53 |
| 2011/0233771 A1* | 9/2011 | Kwon | H01L 22/20 |
| | | | 257/737 |
| 2013/0026662 A1* | 1/2013 | Iwashige | H01L 23/295 |
| | | | 257/788 |
| 2014/0062496 A1* | 3/2014 | Kwon | G01R 31/2607 |
| | | | 324/501 |
| 2014/0269810 A1* | 9/2014 | Ko | G01B 11/306 |
| | | | 374/1 |
| 2016/0290905 A1* | 10/2016 | Ayotte | G01N 3/42 |
| 2019/0333796 A1* | 10/2019 | Huffaker | H01L 21/67288 |
| 2020/0064287 A1 | 2/2020 | Mori et al. | |

FOREIGN PATENT DOCUMENTS

| | | | | | |
|---|---|---|---|---|---|
| JP | 5689752 | A | | 1/2013 | |
| JP | 6402272 | A | | 11/2019 | |
| KR | 1453336 | A | | 10/2014 | |
| KR | 1928922 | A | | 9/2018 | |
| KR | 20200006469 | A | * | 1/2020 | ....... H01L 21/67242 |
| KR | 2128895 | A | | 5/2020 | |
| SK | 100738252 | B1 | * | 7/2007 | ....... H01L 21/67242 |

* cited by examiner

METHOD OF DETERMINING A CRITICAL TEMPERATURE OF A SEMICONDUCTOR PACKAGE AND APPARATUS FOR PERFORMING THE SAME

CROSS-RELATED APPLICATION

A claim for priority under 35 USC § 119 is made to Korean Patent Application No. 10-2020-0124479, filed on Sep. 25, 2020 in the Korean Intellectual Property Office (KIPO), the entirety of which is hereby incorporated by reference.

BACKGROUND

The present disclosure relates to a method of determining a critical temperature of a semiconductor package, and an apparatus for performing the same. More particularly, the present disclosure relates to a method of determining a critical temperature of a semiconductor package at which swelling of the semiconductor package is generated (i.e., occurs), and an apparatus for performing the method.

Generally, a semiconductor package may include a plurality of layers. In testing the semiconductor package at high temperature, swelling of the semiconductor package may be a result of the layers peeling. A temperature at which the swelling is generated may be characterized as a critical temperature of the semiconductor package.

Conventionally, a person (i.e., an inspector) visually inspects the semiconductor package during testing and recognizes when swelling of the semiconductor package occurs. The temperature at the point at which the inspector visually recognizes swelling in the semiconductor package may be determined as the critical temperature of the semiconductor package. However, because the critical temperature of the semiconductor package is conventionally determined in part by visual inspection performed by a person, the determined critical temperature may not be accurate. Particularly, a plurality of semiconductor packages having a same configuration may be determined to have different critical temperatures.

SUMMARY

Embodiments of the inventive concepts provide a method capable of accurately determining a critical temperature of a semiconductor package. Example embodiments also provide an apparatus for performing the above-mentioned method.

Embodiments of the inventive concepts provide a method of determining a critical temperature of a semiconductor package. In the method of determining the critical temperature of the semiconductor package, heat is applied to the semiconductor package. Temperatures of the semiconductor package are measured during the applying of the heat. Heights of the semiconductor package are measured during the applying of the heat. A temperature from among the measured temperatures of the semiconductor package at a point at which a height from among the measured heights of the semiconductor package is sharply increased so that swelling of the semiconductor package occurs is determined as the critical temperature of the semiconductor package.

Embodiments of the inventive concepts further provide an apparatus for determining a critical temperature of a semiconductor package. The apparatus may include a heater, a temperature sensor, a height sensor and a controller. The heater applies heat to the semiconductor package. The temperature sensor measures temperatures of the semiconductor package during application of the heat. The height sensor measures heights of the semiconductor package during application of the heat. The controller determines a temperature from among the measured temperatures of the semiconductor package at a point at which a height from among the measured heights of the semiconductor package is sharply increased so that swelling of the semiconductor package occurs as the critical temperature of the semiconductor package.

Embodiments of the inventive concepts may still further provide an apparatus for determining critical temperatures of a plurality of semiconductor package. The apparatus includes a plurality of heaters, a plurality of temperature sensors, a plurality of first actuators, a height sensor module, a second actuator and a controller. The plurality of heaters may apply heat to the plurality of semiconductor packages. The plurality of temperature sensors measure temperatures of the plurality of semiconductor packages during application of the heat. The plurality of first actuators are installed at the plurality of temperature sensors, and move the plurality of temperature sensors in a first horizontal direction and a second horizontal direction substantially perpendicular to the first horizontal direction. The height sensor module scans the plurality of semiconductor packages along the first horizontal direction or the second horizontal direction to measure heights of the plurality of semiconductor packages during application of the heat. The controller determines temperatures from among the measured temperatures of each of the plurality of semiconductor packages at points at which heights from among the measured heights of the plurality of semiconductor packages are sharply increased so that swelling of the plurality of semiconductor packages occur as the critical temperatures of the plurality of semiconductor packages.

According to example embodiments, when heat is applied to a semiconductor package, swelling may be generated in the semiconductor package. The height of the semiconductor package may be sharply increased by the swelling. The temperature of the semiconductor package measured when the height of the semiconductor package is sharply increased may be determined as the critical temperature of the semiconductor package. Thus, the critical temperature of the semiconductor package may be accurately determined.

BRIEF DESCRIPTION OF THE DRAWINGS

Example embodiments will be more clearly understood from the following detailed description taken in conjunction with the accompanying drawings.

DETAILED DESCRIPTION OF THE EMBODIMENTS

Hereinafter, example embodiments will be explained in detail with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
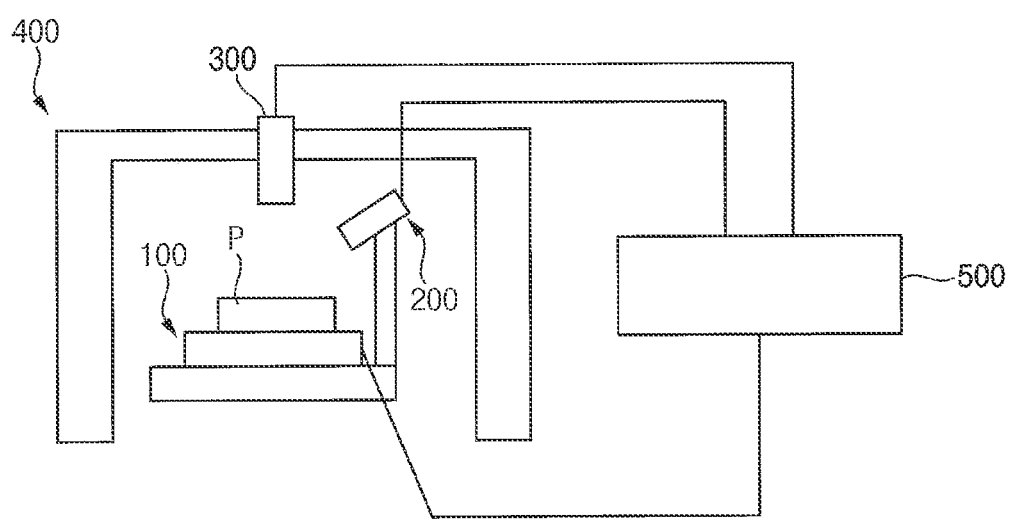
FIG. 1 illustrates a block diagram of an apparatus for determining a critical temperature of a semiconductor package in accordance with embodiments of the inventive concepts.
Figure 2:
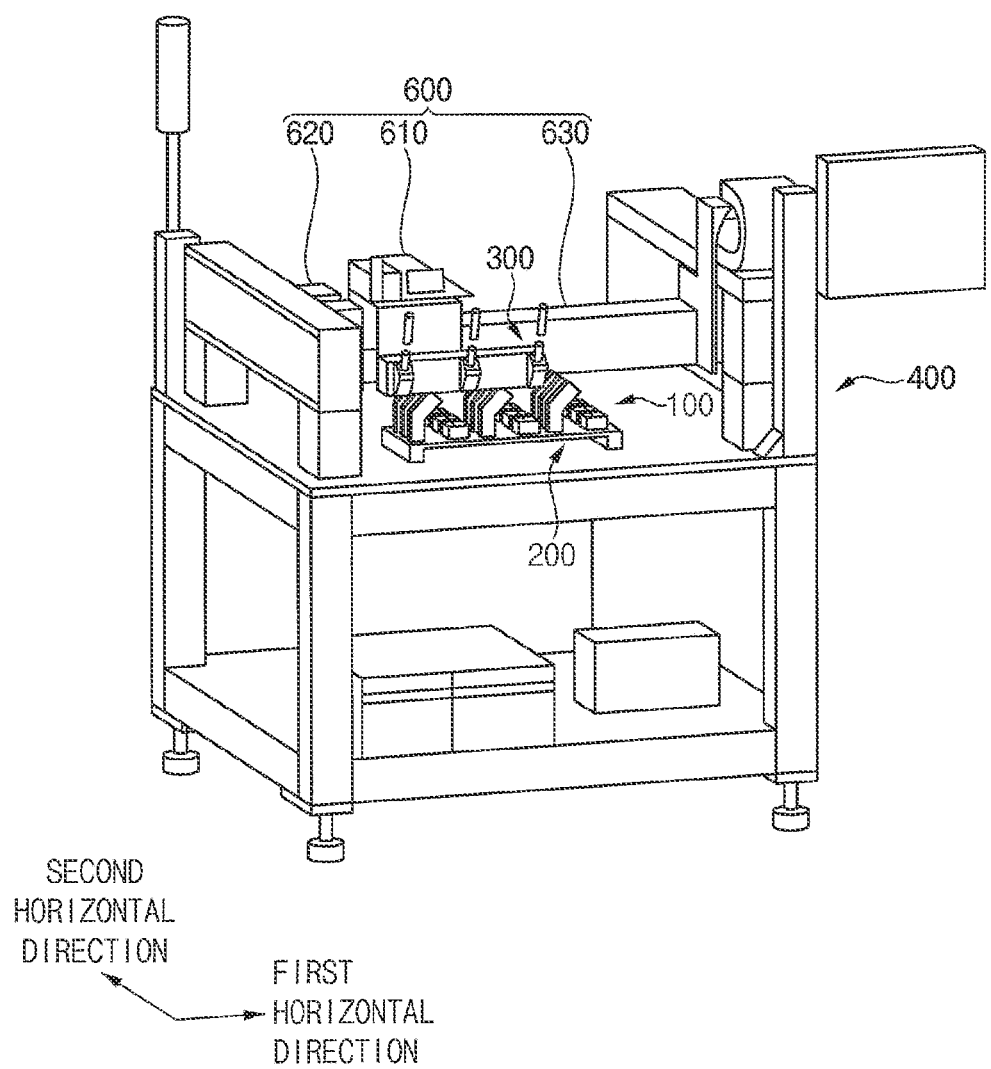
FIG. 2 illustrates a perspective view of the apparatus in FIG. 1.

FIG. 1 illustrates a block diagram of an apparatus for determining a critical temperature of a semiconductor package in accordance with example embodiments of the inventive concepts. FIG. 2 illustrates a perspective view of the apparatus in FIG. 1.

Referring to FIGS. 1 and 2, the apparatus determines a critical temperature of a semiconductor package P at which swelling is generated (i.e., occurs) in the semiconductor package P. Swelling of the semiconductor package P may be the result of peeling of layers in the semiconductor package P at high temperature. For example, the semiconductor package P may include a plurality of elements such as a package substrate, an interposer, a semiconductor chip, etc. The elements of the semiconductor package P may have respective different thermal expansion coefficients. Thus, when heat is applied to the semiconductor package P, warpage may be generated or occur in the semiconductor package P due to the different thermal expansion coefficients of the elements. The warpage may bring about swelling so that interfaces between the layers of the semiconductor package P may be separated from each other. A temperature at which swelling is generated or occurs may correspond to the critical temperature of the semiconductor package P.

In example embodiments, the apparatus may include a heater 100, a temperature sensor 200, a height sensor module 300 and a controller 500. The heater 100, the temperature sensor 200 and the height sensor module 300 may be installed on the gantry 400.

The semiconductor package P may be arranged on an upper surface of the heater 100. The heater 100 may apply heat to the semiconductor package P.

The temperature sensor 200 may be arranged at a side of the heater 100. For example, the temperature sensor 200 may be installed on a bracket 410 (e.g., see FIG. 3) of the gantry 400. The temperature sensor 200 may measure a temperature of the semiconductor package P heated by the heater 100.

The height sensor module 300 may be arranged over the heater 100. The height sensor module 300 may measure a height of the semiconductor package P heated by the heater 100. As mentioned above, when the heater 100 applies heat to the semiconductor package P, warpage may occur at the semiconductor package P. The warpage may change the height of the semiconductor package P. The height sensor module 300 may measure changes in height of the semiconductor package P in accordance with temperatures of the semiconductor package P. Further, the height sensor module 300 may also measure height changes by regions of the semiconductor package P.

Figure 6:
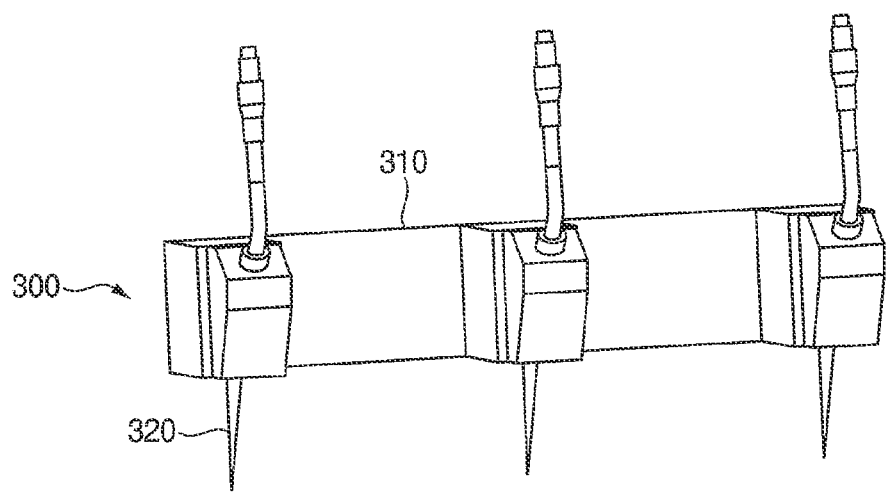
FIG. 6 illustrates a perspective view of a height sensor module applied to the heaters and the temperature sensors in FIG. 5.

The height sensor module 300 may include a height sensor 320 (e.g., see FIG. 6). The height sensor 320 may for example include a point sensor, a line sensor, etc. In some embodiments, when the height sensor 320 includes the line sensor, the height sensor 320 may scan the semiconductor package P to measure the heights of the semiconductor package P. For example, the height sensor 320 may measure the height of the semiconductor package P at different regions.

The height sensor module 300 may be moved by a first actuator 600 along a first horizontal direction and a second horizontal direction substantially perpendicular to the first horizontal direction. The first actuator 600 may include a first driver 610 that moves the height sensor module 300 along the first horizontal direction, and a second driver 620 that moves the height sensor module 300 along the second horizontal direction.

The first driver 610 may include a motor. For example, the first driver 610 may include a coreless motor. The second driver 620 may be movably connected to a guide rail 630 installed at the gantry 400. The second driver 620 may include a core type motor.

The first driver 610 may move the second driver 620 along the guide rail 630, i.e., the first horizontal direction. The height sensor module 300 may be connected to the second driver 620. The second driver 620 may move the height sensor module 300 along the second horizontal direction.

The controller 500 may control operations of the heater 100, the temperature sensor 200 and the height sensor module 300. The controller 500 may be implemented with hardware, firmware, software, or any combination thereof. For example, the controller 500 may be a computing device such as a workstation computer, a desktop computer, a laptop computer, and a tablet computer or the like. For example, the controller 500 may include a memory device such as read only memory (ROM) and random access memory (RAM), and a processor configured to perform predetermined operations, e.g., a microprocessor, a CPU, a GPU. Also, the controller 500 may include a receiver and a transmitter for receiving and transmitting electrical signals.

For example, the controller 500 may control the heat applied from the heater 100 to the semiconductor package P. Further, the controller 500 may set a rapid temperature-rising period and a critical temperature measurement period for the heater 100. The controller 500 may receive the temperatures of the semiconductor package P measured by the temperature sensor 200. The controller 500 may receive the height of the semiconductor package P measured by the height sensor module 300.

The controller 500 may identify a point at which a height of the semiconductor package P measured by the height sensor module 300 is sharply increased. As the temperature of the semiconductor package P is gradually increased, the warpage may also continuously increase. Eventually, the separation of the elements in the semiconductor package P (i.e., the continuous increasing of the warpage) may cause swelling. The height of the semiconductor package P, which may have gradually increased, may be sharply increased by the swelling. A temperature of the semiconductor package P corresponding to a point at which the height of the semiconductor package P is sharply increased may correspond to the critical temperature of the semiconductor package P. The controller 500 thus may determine the temperature of the semiconductor package P corresponding to the point at which the height of the semiconductor package P is sharply increased as the critical temperature of the semiconductor package P.

The swelling may be continuously generated over a range of temperatures as well as at any one temperature point. In example embodiments, the controller 500 may set a temperature of a point within the range of temperatures at which a height change rate of the semiconductor package P is maximum as the critical temperature of the semiconductor package P.

Further, the controller 500 may receive the height changes at regions of the semiconductor package P from the height sensor module 300. The controller 500 may accurately recognize a region of the semiconductor package P at which the warpage may be generated based on the height changes at the regions.

Figure 3:
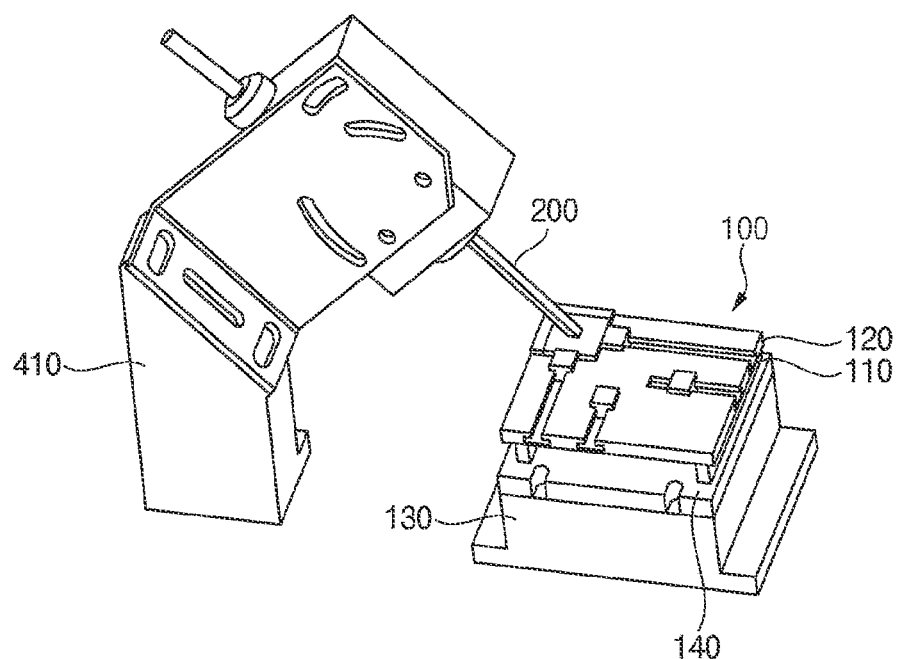
FIG. 3 illustrates an enlarged perspective view of a heater and a temperature sensor of the apparatus in FIG. 2.
Figure 4:
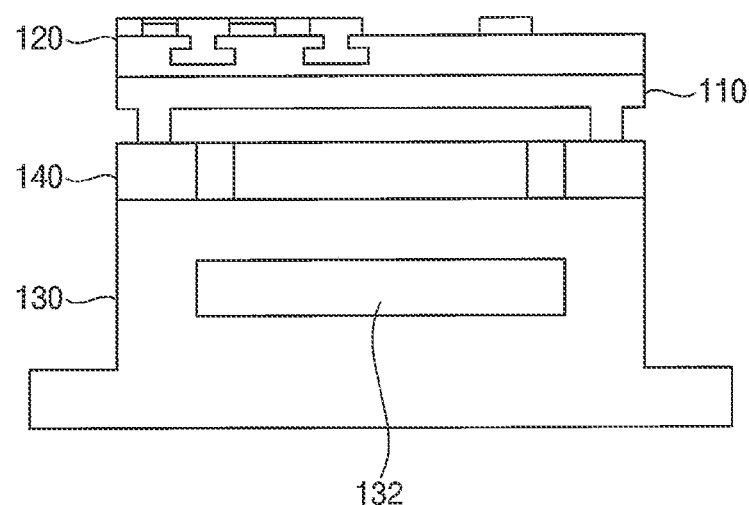
FIG. 4 illustrates a cross-sectional view of the heater in FIG. 3.

FIG. 3 illustrates an enlarged perspective view of a heater and a temperature sensor of the apparatus in FIG. 2. FIG. 4 illustrates a cross-sectional view of the heater in FIG. 3.

Referring to FIGS. 3 and 4, the heater 100 may include a heating block 110, a fixing block 120, a base block 130 and an adiabatic block 140.

The heating block 110 may include an upper surface configured to receive the semiconductor package P. The fixing block 120 may be arranged on the upper surface of the heating block 110 to fix the semiconductor package P. Particularly, the fixing block 120 may fix semiconductor packages P having various sizes. In some embodiments the inventive concepts the fixing block 120 may include brass, but in other embodiments the fixing block 120 may include other materials.

The base block 130 may be arranged under the heating block 110. In order to rapidly cool the heating block 110 after determining the critical temperature of the semiconductor package P, a cooling passage 132 may be formed in the base block 130. A cooling fluid may be introduced into the cooling passage 132 to cool the heating block 110. The adiabatic block 140 may be interposed between the base block 130 and the heating block 110. In some embodiments the adiabatic block 140 may include ceramic, but in other embodiments the adiabatic block 140 may include other materials.

The temperature sensor 200 may be arranged over the heater 100. The bracket 410 may be installed at a side of the heater 100. The bracket 410 may have a slanted surface oriented toward the upper surface of the heater 100. The temperature sensor 200 may be installed at the slanted surface of the bracket 410. Thus, the temperature sensor 200 may be oriented toward the upper surface of the heater 100 along a slanted direction. For example, the temperature sensor 200 may be oriented toward a central portion of the semiconductor package P on the upper surface of the heater 100. In some embodiments the temperature sensor 200 may include an infrared ray (IR) sensor, however in other embodiments the temperature sensor 200 may include other types of sensors instead of an IR sensor.

Figure 5:
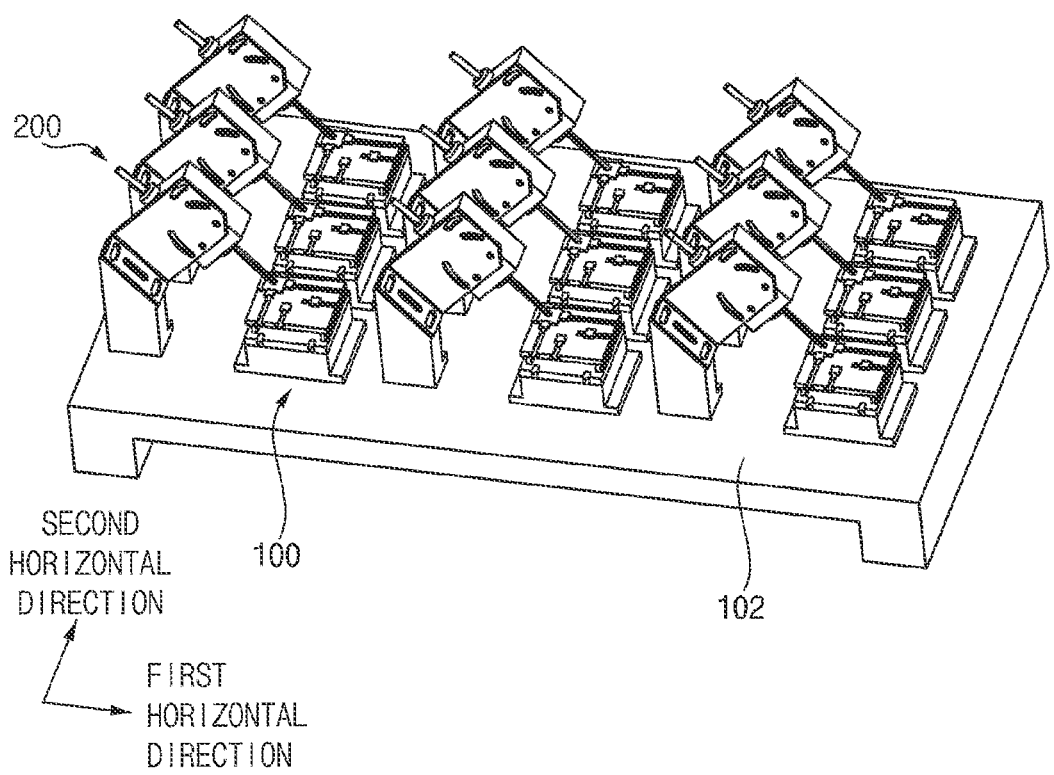
FIG. 5 illustrates a perspective view of a plurality of the heaters and a plurality of the temperature sensors in FIG. 3.
Figure 7:
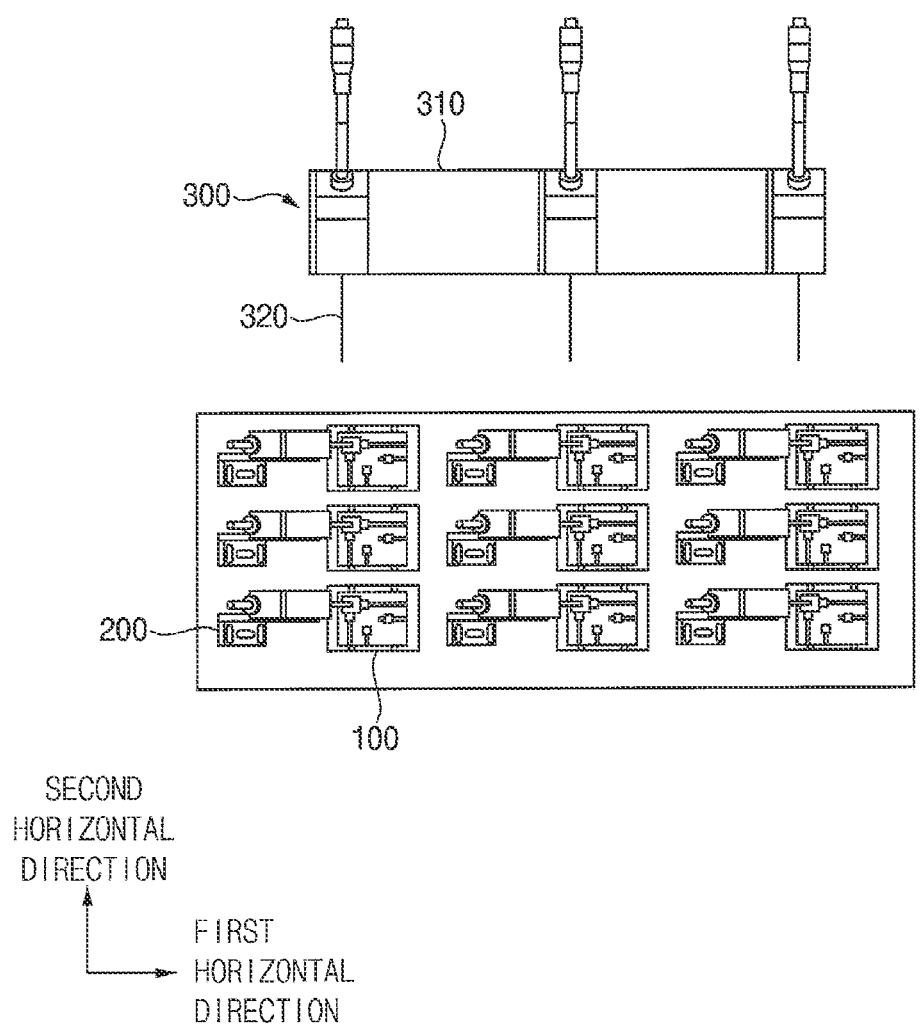
FIG. 7 illustrates a perspective view of the height sensor module in FIG. 6 applied to the heater and the temperature sensors in FIG. 5.

FIG. 5 illustrates a perspective view of a plurality of the heaters and a plurality of the temperature sensors such as shown in FIG. 3, for a corresponding plurality of semiconductor packages P. FIG. 6 illustrates a perspective view of a height sensor module for use with the heaters and the temperature sensors in FIG. 5. FIG. 7 illustrates a perspective view of the height sensor module in FIG. 6 applied to the heaters and the temperature sensors in FIG. 5.

Referring to FIGS. 5 to 7, in order to simultaneously determine the critical temperatures of the semiconductor packages P, a plurality of the heaters 100 may be arranged on an upper surface of a base plate 102. The heaters 100 may be arranged in the first horizontal direction and the second horizontal direction. Respective semiconductor packages P may be arranged on the plurality of heaters 100.

Each of the temperature sensors 200 may be arranged adjacent to respective ones of the heaters 100. That is, one temperature sensor 200 may measure the temperature of one semiconductor package P on one heater 100. Thus, the temperature sensors 200 may also be arranged in the first horizontal direction and the second horizontal direction.

The height sensor module 300 may include a sensing block 310 and a plurality of height sensors 320. The height sensors 320 may be attached to the sensing block 310. A gap between the height sensors 320 may correspond to a gap between the heaters 100.

The number of height sensors 320 may correspond to the number of heaters 100 arranged along the first horizontal direction. For example, when the number of heaters 100 along the first horizontal direction is three and the number of heaters 100 along the second horizontal direction is three such as shown in FIGS. 5 and 7, the number of height sensors 320 attached to the sensing block 310 may also be three. When the sensing block 310 is moved along the second horizontal direction, the three height sensors 320 may scan the three semiconductor packages P on the three heaters 100 to simultaneously measure the heights of the three semiconductor packages P that are disposed along the first horizontal direction in the second row. The height sensor module 300 including the three height sensors 320 may thus make one scanning pass along the second horizontal direction to measure the heights of the nine semiconductor packages P. That is, sensing block 310 may simultaneously measure the heights of the semiconductor packages P arranged in a same direction, i.e., the first horizontal direction. In the embodiment shown in FIGS. 5 and 7, the number of heaters 100 along the first horizontal direction and the second horizontal direction is three, but in other embodiments the number of heaters 100 disposed along the first and second horizontal directions may be greater or less than three.

Figure 8:
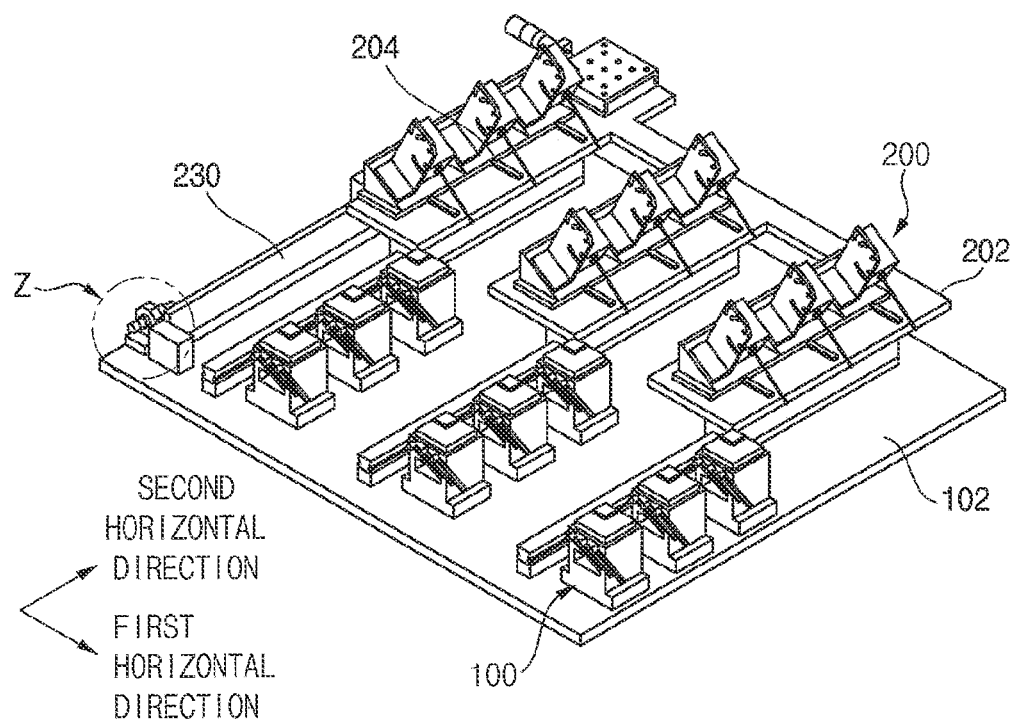
FIG. 8 illustrates a perspective view of the temperature sensors in FIG. 5 moved along the second horizontal direction by a first driver of a second actuator according to embodiments of the inventive concepts.
Figure 9:
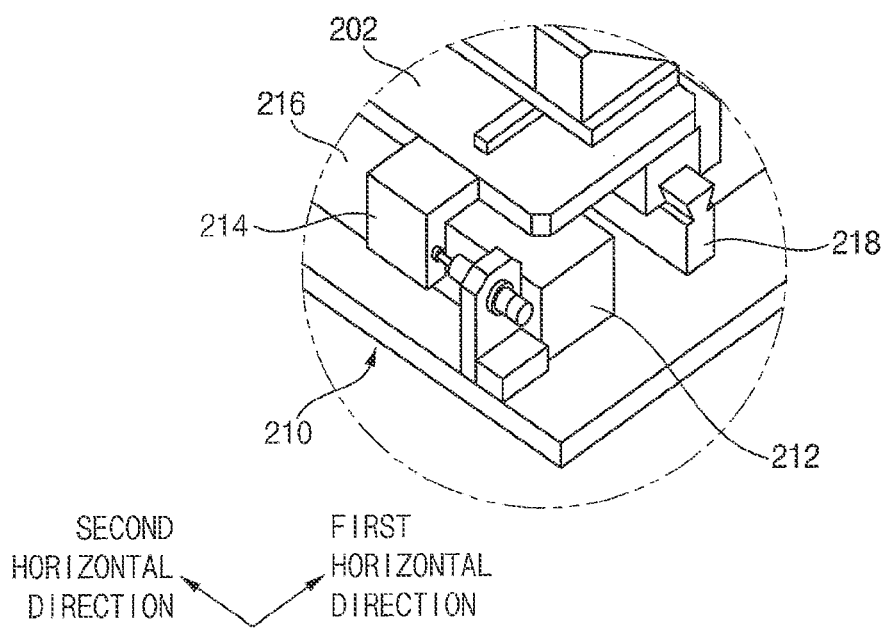
FIG. 9 illustrates an enlarged perspective view of a portion "Z" in FIG. 8.
Figure 10:
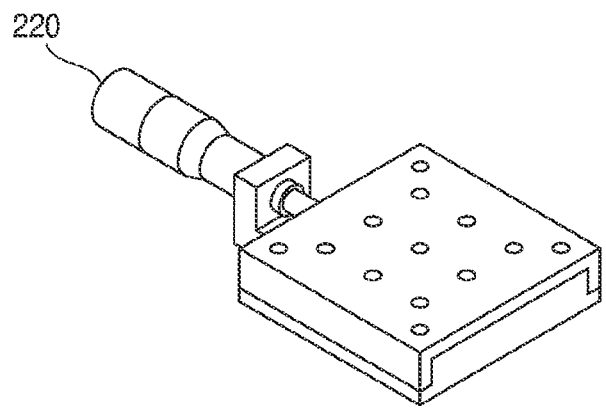
FIG. 10 illustrates a perspective view of a second driver of the second actuator for moving the temperature sensors in FIG. 8 along the first horizontal direction.
Figure 11:
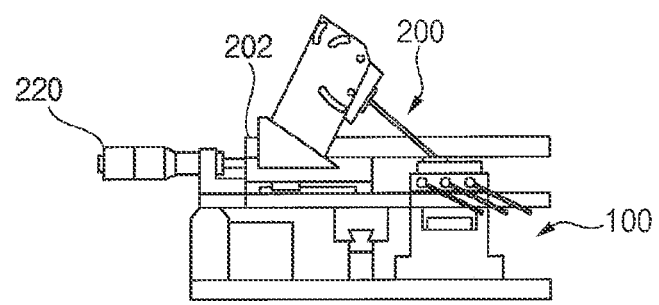
FIGS. 11 and 12 illustrate cross-sectional views of the temperature sensors moved along the first horizontal direction by the second driver of the second actuator in FIG. 10.
Figure 12:
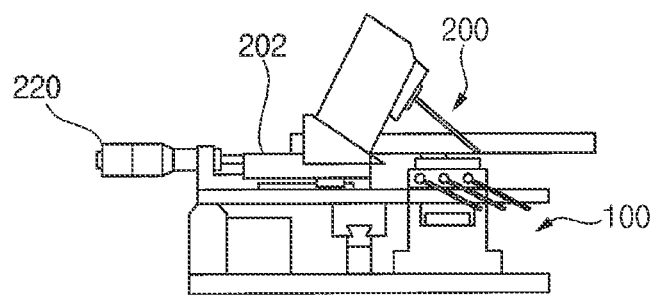

FIG. 8 illustrates a perspective view of the temperature sensors in FIG. 5 moved along the second horizontal direction by a first driver of a second actuator according to embodiments of the inventive concepts. FIG. 9 illustrates an enlarged perspective view of a portion "Z" in FIG. 8. FIG. 10 illustrates a perspective view of a second driver of the second actuator for moving the temperature sensors in FIG. 8 along the first horizontal direction. FIGS. 11 and 12 illustrates cross-sectional views of the temperature sensors moved along the first horizontal direction by the second driver of the second actuator in FIG. 10;

Referring to FIGS. 8 to 10, a temperature sensor 200 may measure a temperature of the central portion of a semiconductor package P. That is, a temperature sensor 200 may be aligned with the central portion of a semiconductor package P to accurately measure the temperature of the semiconductor package P. A position of the central portion of a semiconductor package P may change in accordance with a size of the semiconductor package P, so that it may be required to move the temperature sensor 200 along the first horizontal direction and the second horizontal direction in accordance with the size of the semiconductor package P loaded onto the heater 100.

Thus, the temperature sensors 200 may be moved along the first horizontal direction and the second horizontal direction by a second actuator. The second actuator may include a first driver 210 that moves the temperature sensor 200 along the second horizontal direction, and a second driver 220 that moves the temperature sensor 200 along the first horizontal direction.

The first driver 210 may include a motor 212, a ball screw 216, a slider 214 and a guide rail 218. The ball screw 216 may be arranged along the second horizontal direction. The ball screw 216 may be rotated by the motor 212. The slider 214 may be engaged with the ball screw 216. Thus, the slider 214 may be reciprocally moved along the second horizontal direction in accordance with the rotational direction of the ball screw 216.

The plurality of the temperature sensors 200 may be arranged at a stage 202. The stage 202 may be connected to the slider 214. Thus, the stage 202 may be moved together with the slider 214 along the second horizontal direction. Alternatively, the temperature sensors 200 may be directly connected to the slider 214. The guide rail 218 may be arranged along the second horizontal direction to guide the movement of the stage 202. That is, the stage 202 may be movably connected to the guide rail 218 along the second horizontal direction.

For example, in order to prevent interference between the semiconductor packages P and the temperature sensors 200 during loading of the semiconductor packages P onto the heaters 100, a cylinder 230 may be arranged on the base plate 102 along the second horizontal direction. The stage 202 may be connected to the cylinder 230. The cylinder 230 may move the stage 202 along the second horizontal direction to expose the heaters 100. After loading of the semiconductor packages P, the cylinder 230 may return the stage 202 to an original position to place the temperature sensors 200 adjacent to the heaters 100.

The second driver 220 may include a step motor. With the temperature sensors 200 arranged on the stage 202, the second driver 220 may move the temperature sensors 200 on the stage 202 along the first horizontal direction. Thus, the temperature sensors 200 may be movably connected to the upper surface of the stage 202 along the first horizontal direction. For example, the temperature sensors 200 may be movably inserted into guide grooves formed on the upper surface of the stage 202 along the first horizontal direction.

As shown in FIGS. 11 and 12, the temperature sensors 200 may be forwardly or backwardly moved on the upper surface of the stage 202 along the first horizontal direction in accordance with rotational direction of the second driver 220.

Figure 13:
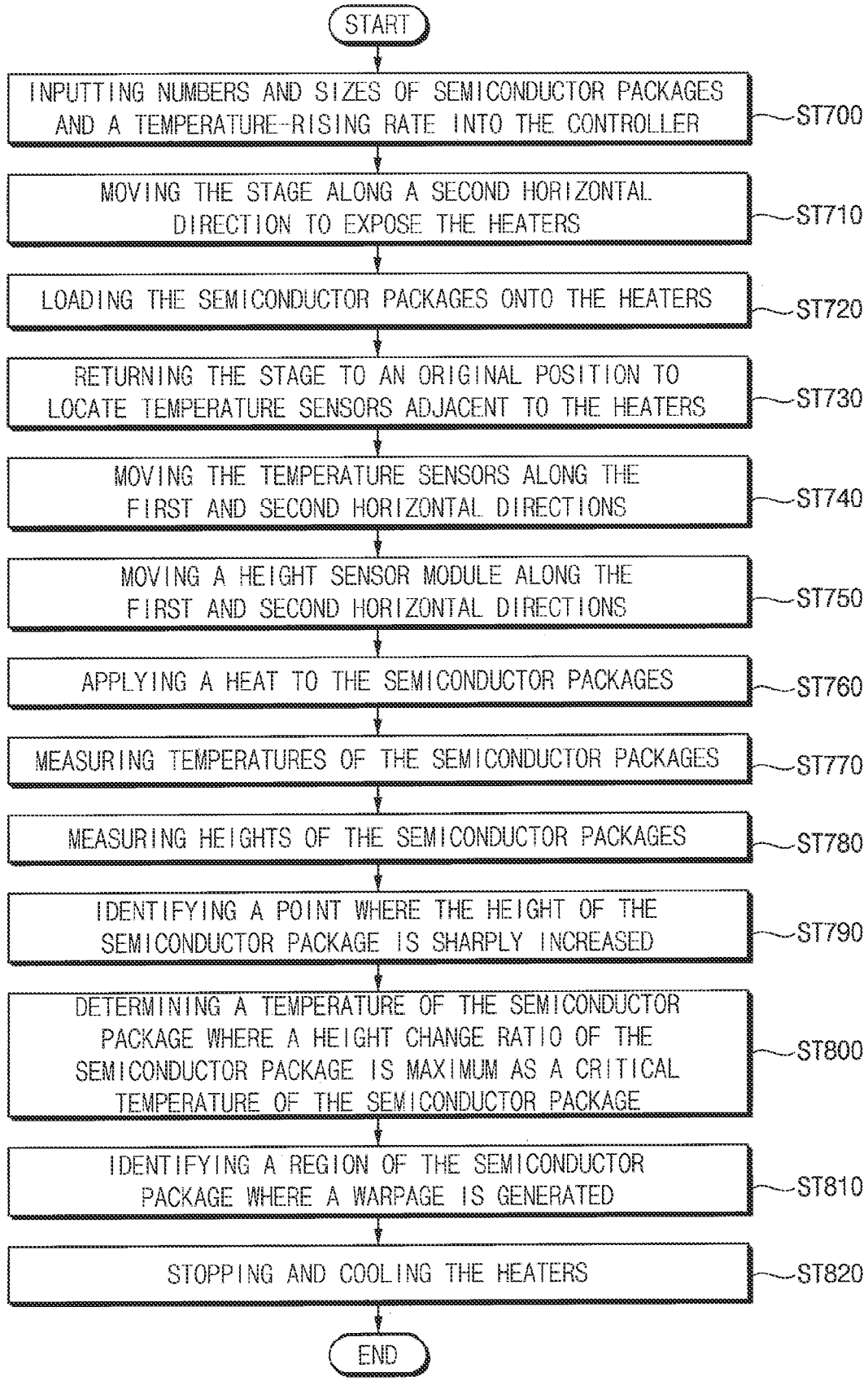
FIG. 13 illustrates a flow chart of a method of determining a critical temperature of a semiconductor package using the apparatus in FIG. 1.
Figure 14:
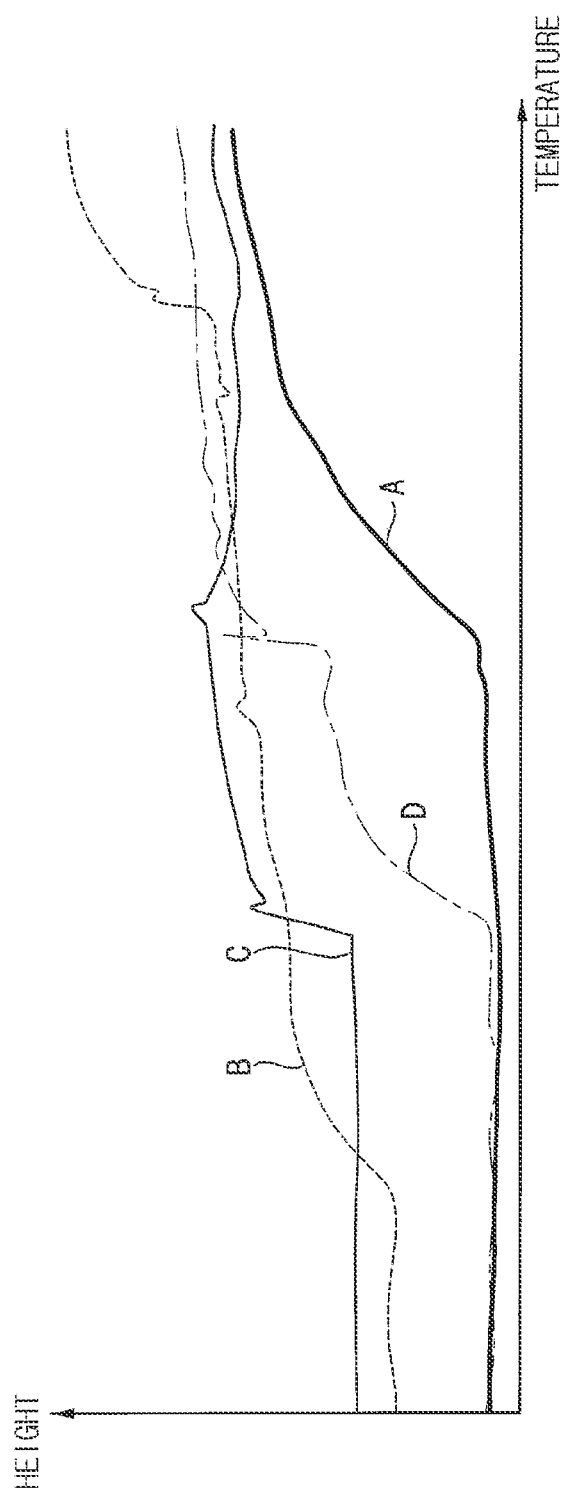
FIG. 14 illustrates a graph showing heights of a plurality of semiconductor packages in accordance with temperature.
Figure 15:
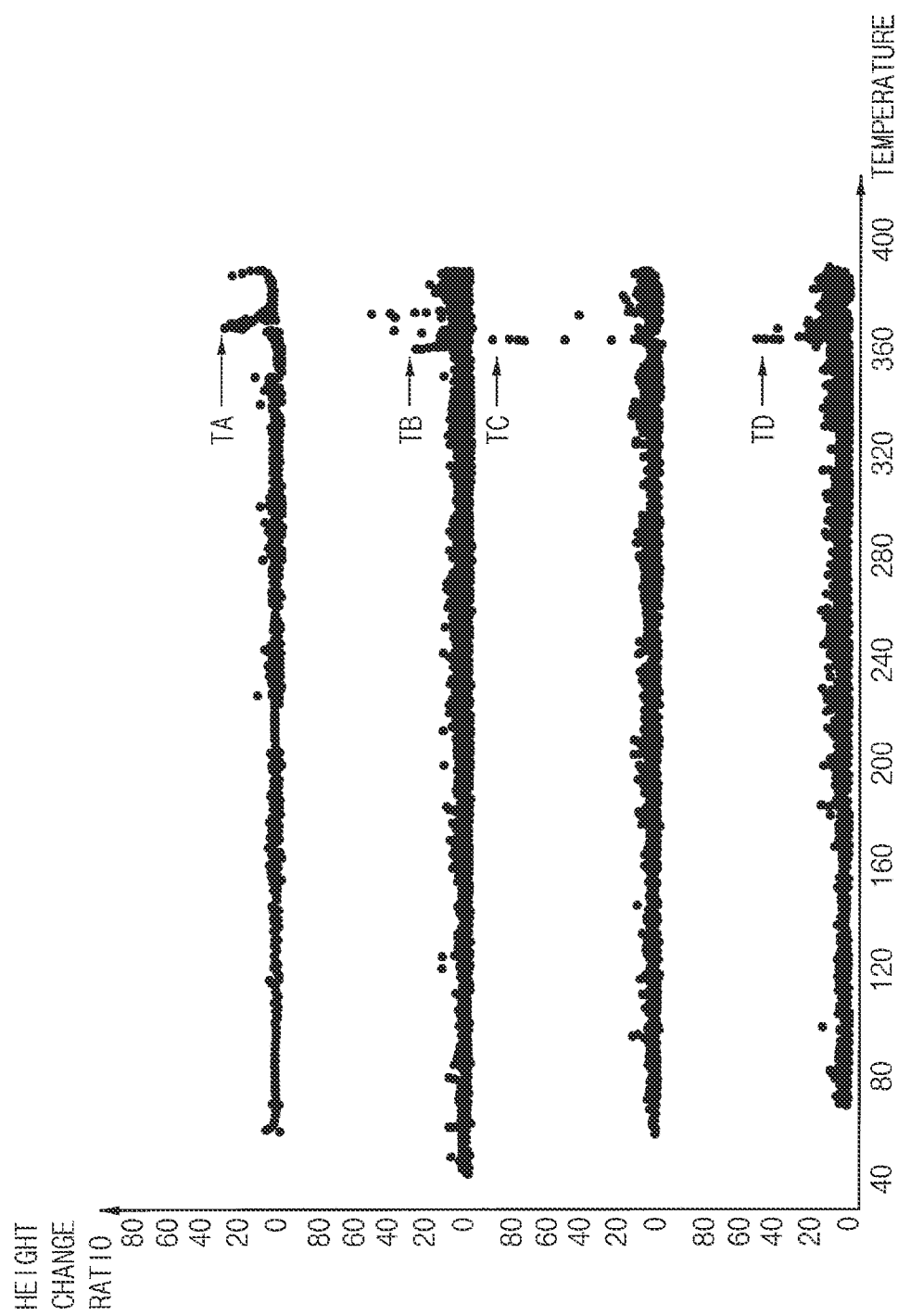
FIG. 15 illustrates a graph showing change rate of heights of semiconductor packages in accordance with temperature.
Figure 16:
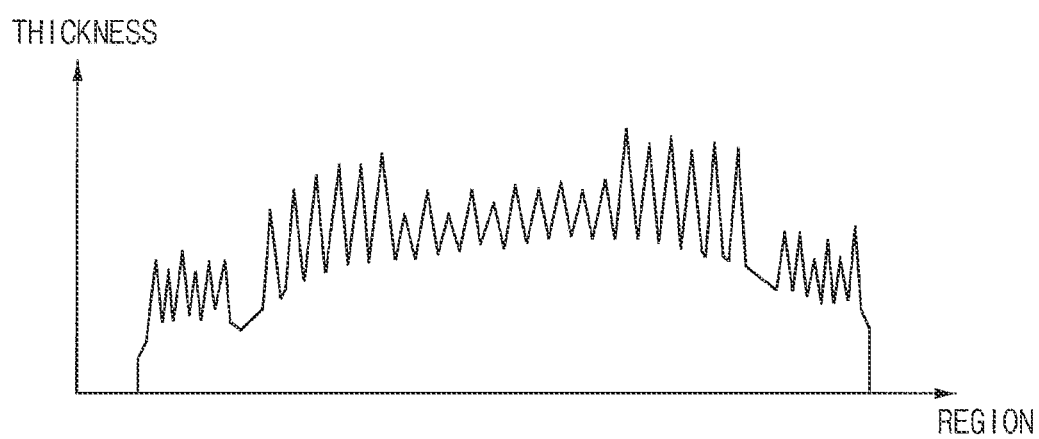
FIG. 16 illustrates a graph showing heights by positions of a semiconductor package in accordance with temperature.

FIG. 13 illustrates a flow chart of a method of determining a critical temperature of a semiconductor package using the apparatus in FIG. 1. FIG. 14 illustrates a graph showing heights of a plurality of semiconductor packages in accordance with temperatures. FIG. 15 illustrates a graph showing change rate of heights of semiconductor packages in accordance with temperatures. FIG. 16 illustrates a graph showing heights by positions of a semiconductor package in accordance with temperatures.

Referring to FIGS. 1-13, in step ST700, the number of the semiconductor packages P, sizes of the semiconductor packages P, a temperature-rising rate, etc., are input to the controller 500. In example embodiments, critical temperatures of first to fourth semiconductor packages P may be determined.

In step ST710, the cylinder 230 moves the stage 202 along the second horizontal direction to expose the heaters 100.

In step ST720, the semiconductor packages P are loaded onto the heaters 100. The semiconductor packages P may be placed on the upper surfaces of the heating blocks 110, respectively. The fixing block 120 of a heater 100 may fix a semiconductor package P to the upper surface of a heating block 110.

In step ST730, the cylinder 230 moves the stage 202 along the second horizontal direction to return the stage 202 to the original position. Thus, each of the temperature sensors 200 may be positioned adjacent to respective ones of the heaters 100.

In step ST740, the second actuator moves the temperature sensors 200 along the first horizontal direction and the second horizontal direction to locate the temperature sensors 200 adjacent to the central portions of the semiconductor packages P.

In step ST750, the first actuator 600 moves the height sensor module 300 along the first horizontal direction and the second horizontal direction to place the height sensor module 300 at an optimal position where the height sensor module 300 may accurately measure the heights of the semiconductor packages P.

In step ST760, the heaters 100 apply heat to the semiconductor packages P to increase the temperature of the semiconductor packages P. The heaters 100 may rapidly increase the temperature of the semiconductor package P during the rapid temperature-rising period. After the rapid temperature-rising period, the heaters 100 may slowly increase the temperature of the semiconductor packages P.

In step ST770, the temperature sensors 200 measure the temperature of the semiconductor packages P. The temperature of the semiconductor packages P measured by the temperature sensors 200 may be transmitted to the controller 500.

In step ST780, the height sensor module 300 measures the height of the semiconductor packages P. The height sensor module 300 may measure the heights of the semiconductor packages P as the heat applied to the semiconductor packages is gradually increased. For example, the line sensor type height sensor module 300 may scan the semiconductor packages P to simultaneously measure the heights of the semiconductor packages P. The heights of the semiconductor packages P measured by the height sensor module 300 may be transmitted to the controller 500.

In step ST790, as shown in FIG. 14, the controller 500 identifies height changes of the semiconductor packages P in accordance with the temperatures of the semiconductor packages P. In FIG. 14, a line A may represent a height of the first semiconductor package, a line B may represent a height of the second semiconductor package, a line C may represent a height of the third semiconductor package, and a line D may represent a height of the fourth semiconductor package.

The controller 500 may identify points where the heights of the semiconductor packages P are sharply increased. For example, the controller 500 may identify a first point PA at which the height of the first semiconductor package is sharply increased. The controller 500 may identify a second point PB at which the height of the second semiconductor package is sharply increased. The controller 500 may identify a third point PC at which the height of the third semiconductor package is increased. The controller 500 may identify a fourth point PD at which the height of the fourth semiconductor package is sharply increased. That is, the controller 500 may recognize the generation (i.e., the occurrence) of swelling in the first to fourth semiconductor packages in temperature ranges to which the first to fourth points PA, PB, PC and PD may belong.

In step ST800, the controller 500 determines a temperature of the semiconductor packages P measured at points where the height change ratios of the semiconductor packages are maximums in the temperature range in which swelling may be generated as the critical temperatures of the semiconductor packages. For example, as shown in FIG. 15, the controller 500 may identify a point where a height change ratio of the first semiconductor package is a maximum. The controller 500 may determine a temperature of the first semiconductor package measured at the point as a critical temperature TA of the first semiconductor package. The controller 500 may identify a point where a height change ratio of the second semiconductor package is a maximum. The controller 500 may determine a temperature of the second semiconductor package measured at the point as a critical temperature TB of the second semiconductor package. The controller 500 may identify a point where a height change ratio of the third semiconductor package is a maximum. The controller 500 may determine a temperature of the third semiconductor package measured at the point as a critical temperature TC of the third semiconductor package. The controller 500 may identify a point where a height change ratio of the fourth semiconductor package is a maximum. The controller 500 may determine a temperature of the fourth semiconductor package measured at the point as a critical temperature TD of the fourth semiconductor package.

In step ST810, as shown in FIG. 16, the controller 500 identifies a region of a semiconductor package P where the warpage is generated based on the height changes by or at regions of the semiconductor package P received from the height sensor module 500.

In step ST820, after determining the critical temperature of the semiconductor packages P, the controller 500 stops the heaters 100. Further, cooling fluid may be introduced into the cooling passages 132 of the base blocks 130 of the heaters 100 to rapidly cool the semiconductor packages P.

According to example embodiments, when heat is applied to the semiconductor package, swelling may be generated in the semiconductor package. The height of the semiconductor package may be sharply increased by the swelling. The temperature of the semiconductor package measured when the height of the semiconductor package is sharply increased may be determined as the critical temperature of the semiconductor package. Thus, the critical temperature of the semiconductor package may be accurately determined.

The above description is illustrative of example embodiments of the inventive concepts and should not to be construed as limiting. Although a few example embodiments have been described, those skilled in the art should readily appreciate that many modifications are possible in the example embodiments without materially departing from the novel teachings and advantages of the inventive concepts. Accordingly, all such modifications are intended to be included within the scope of the inventive concepts as defined in the claims.

What is claimed is:

1. A method of determining a critical temperature of a semiconductor package, the method comprising:
    applying heat to the semiconductor package;
    measuring successive temperatures of the semiconductor package during the applying of the heat by operating an actuator configured to move a temperature sensor along a first horizontal direction and a second horizontal direction substantially perpendicular to the first horizontal direction;
    measuring heights of the semiconductor package at each of the successive temperatures during the applying of the heat; and
    determining a temperature, as the critical temperature of the semiconductor package, from among the measured temperatures of the semiconductor package at a point at which a height of the semiconductor package is sharply increased so that swelling of the semiconductor package occurs.

2. The method of claim 1, wherein the point at which the height of the semiconductor package is sharply increased comprises a point where a height change ratio of the semiconductor package is a maximum.

3. The method of claim 1, wherein the measuring of the heights of the semiconductor package comprises scanning the semiconductor package at each of the successive temperatures to measure the heights at regions of the semiconductor package.

4. The method of claim 3, further comprising identifying a region from among the regions of the semiconductor package where the swelling occurs based on the measured heights at the regions of the semiconductor package.

5. An apparatus for determining a critical temperature of a semiconductor package, the apparatus comprising:
    a heater configured to apply heat to the semiconductor package;
    a temperature sensor configured to measure successive temperatures of the semiconductor package during application of the heat;
    an actuator configured to move the temperature sensor along a first horizontal direction and a second horizontal direction substantially perpendicular to the first horizontal direction;

a height sensor configured to measure heights of the semiconductor package at each of the successive temperatures during application of the heat; and a controller configured to determine a temperature, as the critical temperature of the semiconductor package, from among the measured temperatures of the semiconductor package at a point at which a height of the semiconductor package is sharply increased so that swelling of the semiconductor package occurs.

6. The apparatus of claim 5, wherein the heater comprises:
a heating block configured to make contact with the semiconductor package to apply the heat to the semiconductor package; and
a fixing block arranged on an upper surface of the heating block to fix the semiconductor package to the heater.

7. The apparatus of claim 6, wherein the heater further comprises:
a base block arranged under the heating block; and
an adiabatic block interposed between the base block and the heating block.

8. The apparatus of claim 7, wherein the base block comprises a cooling passage configured to cool the heater.

9. The apparatus of claim 5, wherein the temperature sensor comprises an infrared ray (IR) sensor.

10. The apparatus of claim 5, further comprising a second actuator configured to move the height sensor along the first horizontal direction and the second horizontal direction.

11. The apparatus of claim 5, wherein the height sensor comprises a point sensor or a line sensor.

12. The apparatus of claim 5, wherein the height sensor is configured to scan the semiconductor package to measure the heights at regions of the semiconductor package, and the controller is configured to identify a region from among the regions of the semiconductor package at which swelling occurs based on the measured heights at the regions of the semiconductor package.

13. An apparatus for determining critical temperatures of a plurality of semiconductor packages, the apparatus comprising:
a plurality of heaters configured to apply heat to the plurality of the semiconductor packages;
a plurality of temperature sensors configured to measure successive temperatures of the plurality of semiconductor packages during application of the heat;
a plurality of first actuators configured to move the plurality of temperature sensors along a first horizontal direction and a second horizontal direction substantially perpendicular to the first horizontal direction;
a height sensor module configured to scan the plurality of semiconductor packages along the first horizontal direction or the second horizontal direction to measure heights of the plurality of semiconductor packages at each of the successive temperatures during application of the heat;
a second actuator configured to move the height sensor module along the first horizontal direction and the second horizontal direction; and
a controller configured to determine temperatures, as the critical temperatures of the plurality of semiconductor packages, from among the measured temperatures of each of the plurality of semiconductor packages at points at which heights from among the measured heights of the plurality of semiconductor packages are sharply increased so that swelling occurs.

14. The apparatus of claim 13, wherein each of the heaters comprises:
a heating block configured to make contact with a semiconductor package from among the plurality of semiconductor packages to apply heat to the semiconductor package; and
a fixing block arranged on an upper surface of the heating block to fix the semiconductor package.

15. The apparatus of claim 14, wherein each of the heaters further comprises:
a base block arranged under the heating block; and
an adiabatic block interposed between the base block and the heating block.

16. The apparatus of claim 15, wherein the base block comprises a cooling passage configured to provide cooling.

17. The apparatus of claim 13, wherein the height sensor module comprises:
a sensing block connected to the second actuator; and
a plurality of height sensors installed at the sensing block and configured to measure the heights of the semiconductor packages.

18. The apparatus of claim 17, wherein the height sensors comprise line sensors.

19. The apparatus of claim 17, wherein the height sensors are configured to scan the semiconductor packages to measure the heights at regions of the semiconductor packages, and the controller is configured to identify respective regions from among the regions of the semiconductor packages at which swelling occurs based on the measured heights of the regions of the semiconductor packages.

* * * * *